US009087796B2

(12) United States Patent
Adam et al.

(10) Patent No.: US 9,087,796 B2
(45) Date of Patent: Jul. 21, 2015

(54) SEMICONDUCTOR FABRICATION METHOD USING STOP LAYER

(71) Applicant: International Business Machines Corporation, Armonk, NY (US)

(72) Inventors: Thomas N. Adam, Slingerlands, NY (US); Donald F. Canaperi, Averill Park, NY (US); Kangguo Cheng, Schenectady, NY (US); Ali Khakifirooz, Mountain View, CA (US); Alexander Reznicek, Troy, NY (US); Raghavasimhan Sreenivasan, Schenectady, NY (US); Charan Veera Venkata Satya Surisetty, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 179 days.

(21) Appl. No.: 13/777,364

(22) Filed: Feb. 26, 2013

(65) Prior Publication Data
US 2014/0242797 A1    Aug. 28, 2014

(51) Int. Cl.
*H01L 21/306* (2006.01)
*H01L 21/321* (2006.01)
*H01L 21/8234* (2006.01)
*H01L 21/84* (2006.01)

(52) U.S. Cl.
CPC .... *H01L 21/3212* (2013.01); *H01L 21/823431* (2013.01); *H01L 21/845* (2013.01)

(58) Field of Classification Search
CPC ............... H01L 21/823431; H01L 21/845
USPC ................................. 438/694, 692
See application file for complete search history.

(56) References Cited

U.S. PATENT DOCUMENTS

| 6,191,050 B1 | 2/2001 | Andideh |
| 6,468,909 B1 | 10/2002 | Marshall |
| 6,531,350 B2 | 3/2003 | Satoh et al. |
| 6,867,128 B2 | 3/2005 | Deleonibus |
| 6,982,464 B2 | 1/2006 | Achuthan et al. |
| 7,201,636 B2 | 4/2007 | Jin et al. |
| 7,955,964 B2 | 6/2011 | Wu et al. |
| 2012/0083125 A1* | 4/2012 | Charns et al. ................. 438/697 |

* cited by examiner

*Primary Examiner* — Duy Deo
*Assistant Examiner* — Mahmoud Dahimene
(74) *Attorney, Agent, or Firm* — David Woycechowsky

(57) ABSTRACT

A method of making a semiconductor assembly including the steps of: (i) providing an initial-state assembly including: (a) a fin layer, and (b) a hard mask layer located on top of at least a portion of the fin layer; (ii) performing a first material removal on the initial-state assembly, by CMP, to yield a second-state assembly; and (iii) performing a second material removal on the second-state assembly to yield a third-state assembly. In the first material-removal step: (i) any remaining portion of the soft sacrificial layer is removed, (ii) a portion of the fin layer is removed, and (iii) the lower portion of the hard mask layer is used as a stop layer for the second material removal.

14 Claims, 3 Drawing Sheets

SEMICONDUCTOR FABRICATION METHOD USING STOP LAYER

FIELD OF THE INVENTION

The present invention relates generally to the field of semiconductor fabrication, and more particularly to the method of manufacturing semiconductors with fin type devices using a process including a chemical mechanical polishing (CMP).

BACKGROUND OF THE INVENTION

Fin type semiconductor devices are known. Such devices typically include: one or more fins (made of semiconductor material) embedded in a semiconductor layer (for example, amorphous silicon). One example of a fin type semiconductor device is a fin field effect transistor (or finFET) device. The layer including the fins and embedding material will herein be collectively referred to as a "fin layer."

It is known to manufacture finFET devices by various processes that include one or more chemical mechanical polishing (CMP) step(s). It is recognized that CMP can cause "dishing," which is a term for relatively-large-scale out-of-plane irregularities in the top surface of the fin layer. More specifically, CMP tends to cause the fin layer to be thicker (that is, has a greater height) in the "fin regions" than in the "non-fin regions" of the semiconductor device footprint. This irregularity can lead to performance issues with the semiconductor device.

SUMMARY

According to an aspect of the present invention, there is a method of making a substantially flat semiconductor assembly defining a thickness dimension, an up direction and a down direction. The method includes the following steps: (i) providing an initial-state assembly including a fin layer, and a hard mask layer located on top of at least a portion of the fin layer; (ii) performing a first material removal on the initial-state assembly to yield a second-state assembly; and (iii) performing a second material removal on the second-state assembly to yield a third-state assembly. The fin layer has a footprint including fins and fin-embedding material and defines: (i) a fin region, and (ii) a non-fin region. In the initial-state assembly: (i) the fin layer is thicker in the fin region than in the non-fin region, (ii) at least a lower portion of the hard mask layer extends over at least a substantial portion of the non-fin region of the fin layer, and (iii) the hard mask layer is absent over at least a substantial portion of the fin region of the fin layer. In the first material-removal step: (i) a portion of the fin layer is removed, and (ii) the lower portion of the hard mask layer is used as a stop layer for the first material removal. In the second material-removal step, material removal is selectively performed so that: (i) the lower portion of the hard mask layer is removed, and (ii) substantially no material is removed from the fin layer.

According to a further aspect of the present invention, there is a method of making a generally flat semiconductor assembly defining a thickness dimension, an up direction and a down direction. The method including the steps of: (i) providing an initial-state assembly including a fin layer, and a hard mask layer located on top of at least a portion of the fin layer; (ii) performing a first material addition on the initial-state assembly to yield a second-state assembly; (iii) performing a first material removal on the second-state sub-assembly to yield a third-state assembly; (iv) performing a second material removal on the second-state assembly to yield a fourth-state assembly; (v) performing a third material removal on the third-state assembly to yield a fifth-state assembly; (vi) performing a fourth material removal on the third-state assembly to yield a sixth-state assembly; and (vii) performing a fifth material removal on the third-state assembly to yield a seventh-state assembly. The fin layer has a footprint that includes fins and fin-embedding material and defines: (i) a fin region, and (ii) a non-fin region. In the initial-state sub-assembly: (i) the fin layer is thicker in the fin region than in the non-fin region, (ii) at least a lower portion of the hard mask layer extends over at least a substantial portion of the non-fin region of the fin layer, and (iii) an upper portion of the hard mask layer extends over at least a substantial portion of the fin region of the fin layer. In the first material-addition step, a soft sacrificial layer is deposited over at least a substantial portion of the hard mask layer. In the first material-removal step, a portion of the soft sacrificial layer is removed so that: (i) the soft sacrificial layer is removed at least from the fin region of the fin layer, and (ii) the upper portion of the hard mask layer is used as a stop layer for the first material removal. In the second material-removal step, the upper portion of the hard mask layer is removed. In the third material-removal step: (i) any remaining portion of the soft sacrificial layer is removed, (ii) a portion of the fin layer is removed, and (iii) the lower portion of the hard mask layer is used as a stop layer for the third material removal. In the fourth material-removal step, the lower portion of the hard mask layer is removed. In the fifth material-removal step, a portion of the fin layer is removed so that the fin layer of the seventh-state assembly has: (i) a uniform thickness, and (ii) a substantially planar top surface.

DETAILED DESCRIPTION

Figure 1:
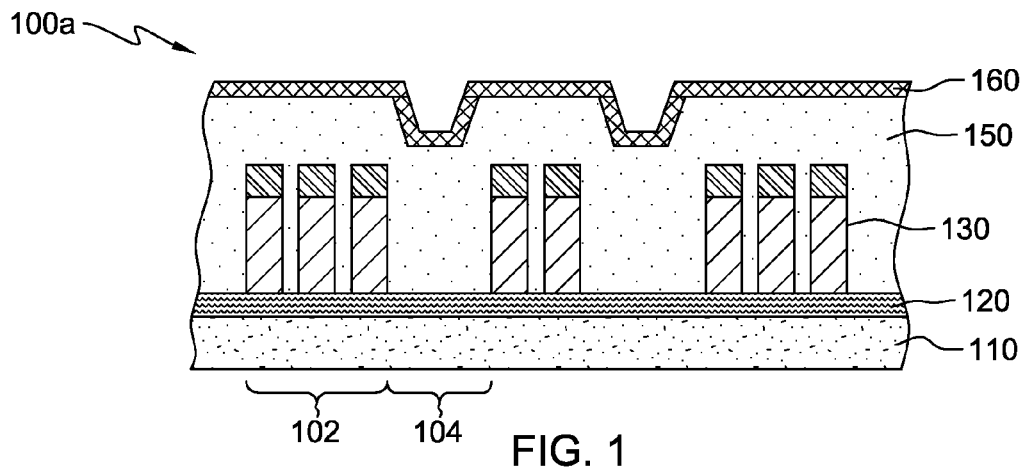
FIG. 1 is a cross-sectional view (Figures are not drawn to scale for clarity of illustration purposes) of a semiconductor device in its first stage of fabrication according to the present invention.

CMP processes are very effective at stopping on various materials. However, the CMP of step morphologies with large open areas can be problematic due to severe dishing. In addition, nested and populated morphologies with varying etch-stop heights are equally challenging. In processes that use no CMP stop layer (also referred to as "blind CMP") high planarization efficiency is generally needed. This can lead to: (i) huge dishing in open areas; (ii) pattern dependency; and/or (iii) gate height variation across different macros. As will now be discussed in detail, the semiconductor device of FIGS. 1 to 7 uses a multi-stack to: (i) achieve height equalization; and (ii) provide more efficient etch stop.

FIGS. 1 to 7 respectively show semiconductor device 100 through seven stages of manufacture 100a to 100g. Device 100 includes, at various stages of manufacture: first stage assembly (or, simply, "first stage") 100a; second stage 100b; third stage 100c; fourth stage 100d; fifth stage 100e; sixth stage 100f; seventh stage 100g; fin region 102; non-fin region 104; semiconductor substrate layer 110; non-conductive oxide layer 120; fins 130; fin-embedding layer 150; hard mask layer 160; and soft sacrificial layer 170. Fins 130 and fin-embedding layer 150, taken together, are herein referred to as fin layer 130,150.

As shown in FIG. 1, first stage 100a is the starting assembly for the fabrication process of FIGS. 1 to 7. To fabricate first stage 100a: (i) make fins 130 (by techniques now conventional or to be developed in the future); (ii) deposit the required post-CMP target thickness of amorphous silicon (a-Si) as fin-embedding layer 150; and (iii) deposit a thin layer of CMP stop layer as hard mask layer 160.

As shown in FIG. 1, at first stage 100a, semiconductor substrate layer 110 is substantially covered with non-conductive oxide layer 120. Non-conductive oxide layer 120 functions as a "buried oxide layer." Non-conductive oxide layer 120 is made of silicon oxide ($SiO_2$). Alternatively, this non-conductive layer could be made of: silicon nitride, silicon oxynitride, similar low dielectric material (preferably having a dielectric constant lower than silicon oxide) or combination thereof. Alternatively, layers 110 and 120 could: (i) be a single layer; (ii) could include more than two distinct layers; or (iii) be omitted.

Fin-embedding layer 150 is made of amorphous silicon (a-Si). Alternatively, this fin-embedding layer could be made of conventional gate materials such as: polycrystalline silicon, crystalline silicon, SiGe, metal alloy, silicide, or any material suitable for embedding fins. Preferably, the fin-embedding layer material should be suitable for making a gate therein.

Fin-embedding layer 150 is covered with hard mask layer 160. The hard mask layer is made of titanium nitride. Alternatively, the hard mask layer could be made of: tantalum nitride, diamond-like carbon, or other material properties such that it will: (i) not act as a CMP stop layer at relatively low footprint density (that is, proportion of coverage by the hard layer in the horizontal plane defined by the top surface of the assembly undergoing fabrication); but (ii) act as a CMP stop layer at a relatively high footprint density (that is, relatively high proportion of coverage by the hard layer taken in the horizontal plane defined by the top surface of the assembly undergoing fabrication). This stop layer aspect of hard mask layer 160 will be more fully discussed below in connection with FIGS. 4 and 5.

As further shown in FIG. 1, fins 130 are embedded in fin-embedding layer 150 with a precise geometry according to the operational design for the semiconductor device being fabricated. In the first stage 100a, fin layer 130, 150 is thicker in fin regions 102 than in non-fin regions 104. This difference between fin regions and non-fin regions: (i) creates a height variation in the top surface of first stage 100a; and (ii) causes hard mask layer 160 to have an upper portion 160a, a lower portion 160b, and a transition portion 160c (see FIGS. 4 to 6).

Figure 2:
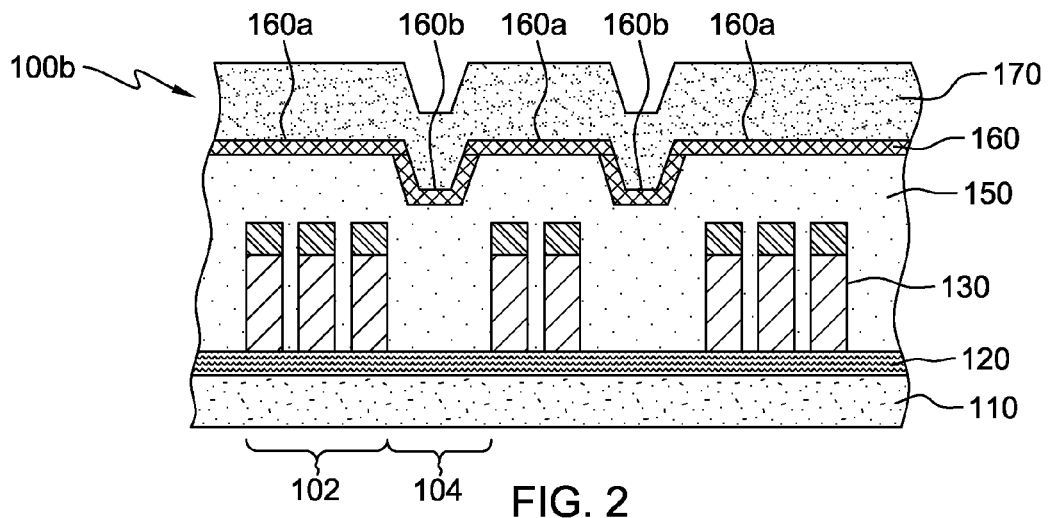
FIG. 2 is a cross-sectional view of the semiconductor device in its second stage of fabrication.

As shown in FIG. 2, a second stage 100b is obtained when soft sacrificial layer 170 is deposited on top of hard mask layer 160. Soft sacrificial layer 170 is made of amorphous silicon, the same material used in fin layer 150. Alternatively, layers 150 and 170 may respectively be made of different materials. In some embodiments, the material chosen for soft sacrificial layer 170 should be suitable for forming gates in the fully manufactured semiconductor device (a-Si is so suitable), but this is not necessarily a required characteristic for every embodiment. Alternatively, soft sacrificial layer 170 can be made of another material, like polysilicon. Preferably, layers 150 and 170 will have similar chemical mechanical polishing (CMP) removal rates (as they will in embodiments where both of these layers are made of a-Si).

Figure 3:
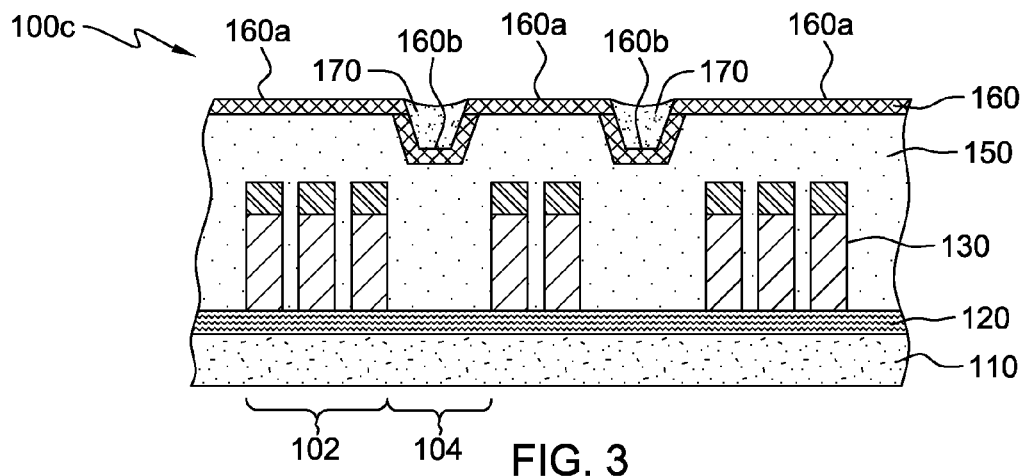
FIG. 3 is a cross-sectional view of the semiconductor device in its third stage of fabrication.

During fabrication, to get from second stage 100b (see FIG. 2) to third stage 100c (see FIG. 3) a CMP is used to remove soft sacrificial layer 170 until the top surface of upper portion 160a of hard mask layer 160 is reached. This CMP will herein be referred to as the "first CMP." CMP is a planarization process that uses a rotating platen having a polishing pad and polishing slurry. In preferred embodiments, the semiconductor device undergoing fabrication is held on a carrier which rotates in the same directions as the platen. The polishing slurry is preferably made up of a colloidal solution that includes a mechanical polishing element, like silica particles suspended, in a carrier solution. As shown in FIG. 3, in third stage 100c, pockets of soft sacrificial layer 170 remain in the non-fin region 104 on top of low portion 160b of hard mask layer 160. At third stage 100c, some dishing may occur in the open field, an embedded stopper prevents out-dishing.

During fabrication, to get from the third stage 100c (see FIG. 3) to fourth stage 100d (see FIG. 4), a selective wet etch process is performed to remove upper portion 160a of the hard mask layer from fin regions 102. Low portion 160b and transition portion 160c of hard mask layer 160 remain because these portions are shielded from the wet etch process by leftover pockets of soft sacrificial layer 170. Other material removal processes (for example, selective dry etch) could be used at this fabrication step so long as the process: (i) reliably removes upper portion 160a of the hard mask layer; and (ii) leaves the remaining pockets of soft sacrificial layer 170 at least substantially intact.

During fabrication, to get from fourth stage 100d (see FIG. 4) to fifth stage 100e (see FIG. 5), CMP is performed to remove: (i) remaining pockets of soft sacrificial layer 170; (ii) transition portion 160c of the hard mask layer; and (iii) an uppermost portion of fin-embedding layer 150. This CMP will herein be referred to as the "second CMP." During this second CMP, lower portion 160b of the hard mask layer prevents, or greatly reduces, dishing in non-fin region 104 during the CMP step by protecting the underlying portions of the fin-embedding layer 150 from material removal during this second CMP processing.

Figure 4:
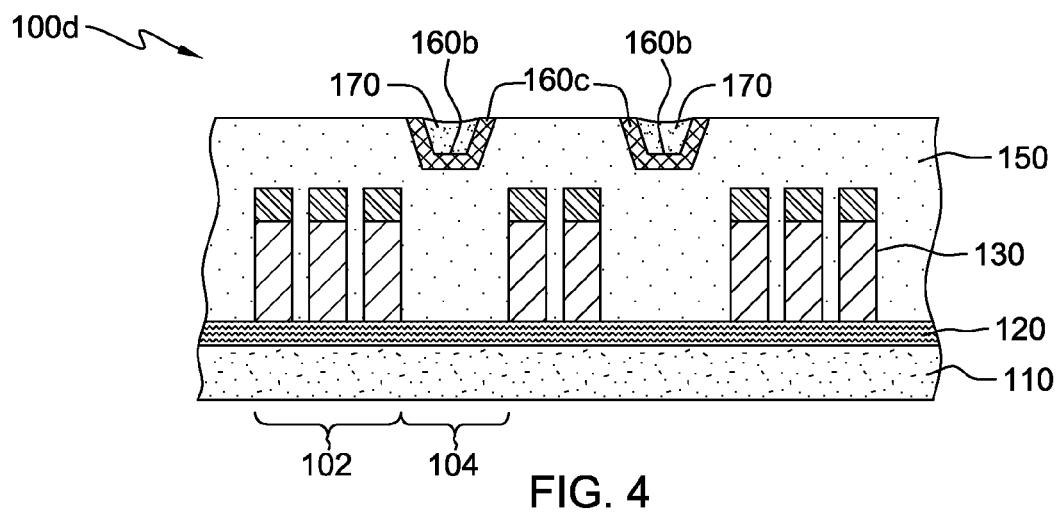
FIG. 4 is a cross-sectional view of the semiconductor device in its fourth stage of fabrication.

In the second CMP process, lower portion 160b of the hard mask layer is used as a "stop layer" for the CMP process (or other material removal process). More specifically, the CMP begins on the top surface of fourth stage assembly 100d, as shown in FIG. 4.

As the CMP begins removing material, the movement(s) of the platen encounter relatively low resistance because the majority of the footprint of the top surface of the fourth stage is made of: (i) fin-embedding layer 150 (which is, in this embodiment, relatively soft a-Si); and (ii) soft sacrificial layer 170 (which, in this embodiment, is also a-Si). While some portion of the footprint of the top surface of the fourth stage 100d is transition portion 160c of the hard mask layer, this material has a relative low density (that is, proportion per unit area) over the footprint of the top surface of the fourth stage. To put it simply, the CMP is removing mostly soft material until the assembly's geometry reaches fifth stage 100e. At that juncture, the lower portion 160b of the hard mask layer has been reached, which means that a substantial proportion of the top surface will be made of hard mask material of layer 160, which is relatively hard and resists removal more than the a-Si material of layers 150 and 170. When this increased resistance of lower portion 160b is detected, the second CMP is stopped to yield fifth stage 100e.

In this embodiment, the increased resistance caused by lower portion 160b of the hard mask layer is sensed by electronic equipment (not shown) that detects torque on the CMP machine (not shown). Alternatively, the detection of the CMP reaching down to lower portion 160b could be accomplished by: (i) detecting a change in friction that occurs upon reaching the stop layer; and/or (ii) detecting spectrographic changes (for example, detecting a spectrographic wavelength shift that occurs when the material(s) being removed, or the relative proportions of materials being removed, changes).

Figure 5:
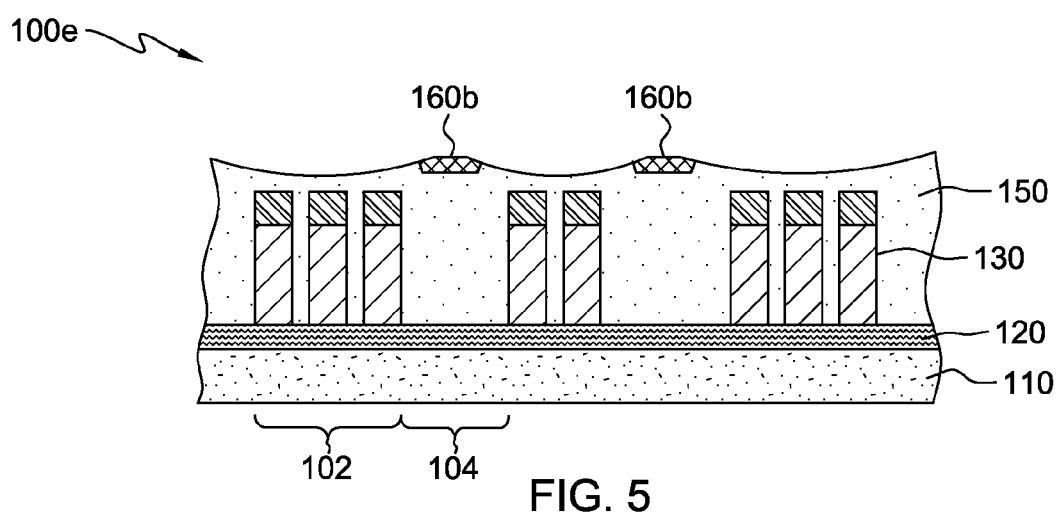
FIG. 5 is a cross-sectional view of the semiconductor device in its fifth stage of fabrication.

In this way, lower portion 160b of the hard mask layer protects underlying portions of fin-embedding layer 150 from material removal during this second CMP process by acting as a stop layer for the second CMP. As shown in FIG. 5, lower portion 160b of hard mask layer 160 remains in the non-fin region 104 which prevents dishing that would otherwise be caused by the second CMP. At fifth stage 100e, as the density will be very low, the stop layer on the side walls will not be enough for CMP to stop on. Some dishing may occur over the fins (as show in FIG. 5), but there is no dishing in the non-fin region because of the remaining portion of the CMP stop layer.

Figure 6:
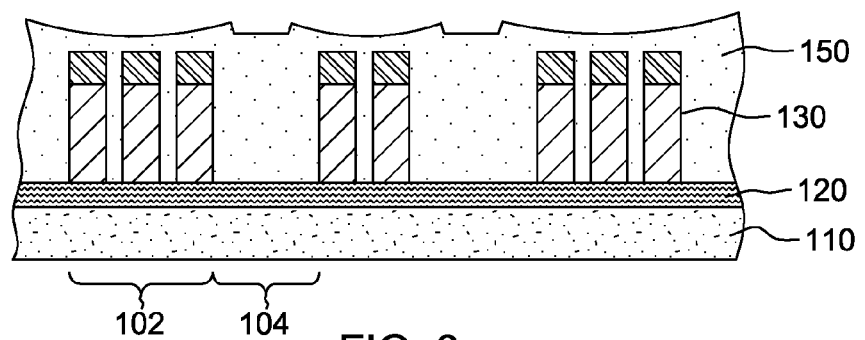
FIG. 6 is a cross-sectional view of the semiconductor device in its sixth stage of fabrication.
Figure 7:
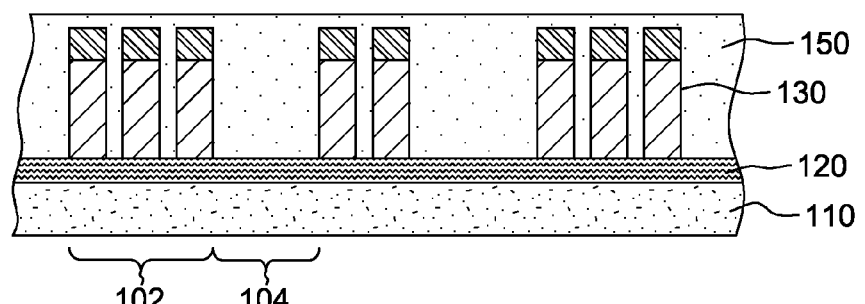
FIG. 7 is a cross-sectional view of the semiconductor device in its seventh stage of fabrication.

During fabrication, to get from fifth stage 100e (see FIG. 5) to the sixth stage 100f (see FIG. 6), a wet etch process is performed to remove the lower portion 160b of the hard mask layer. At the sixth stage 100f, hard mask layer 160 has been completely removed. As shown in FIG. 6, the top surface is not planar after the last remnants of the hard mask layer have been removed.

During fabrication, to get from sixth stage 100f (see FIG. 6) to seventh stage 100g (see FIG. 7), a light polishing is performed (the "third CMP" or "short, touch-up CMP"). In some embodiments, this touch-up CMP is characterized by: (i) relatively short polishing time; (ii) relatively low rotational speeds; and/or (iii) relatively low vertical force. Because the hard mask layer deposited is usually less than 10 nanometers (nm) in thickness, the remaining surface irregularities, and the amount of material to be removed by the touch-up CMP, will be relatively small. This touch-up CMP (in embodiments where it is used) addresses irregularities that are smaller in scale than dishing or topography irregularities. The third CMP yields a smooth planar surface as the top surface of seventh stage 100g. The third CMP avoids dishing because it is a light CMP where relatively little material, from fin layer 130, 150, is removed. In most embodiments, and as will be readily understood by one of ordinary skill in the art, further processing will occur on the seventh stage assembly in order to get to a final semiconductor product. In at least some embodiments, these final products will exhibit improved performance because of the uniform height and/or smooth, planar, horizontally-aligned surface of fin layer 130, 150.

The invention claimed is:

1. A method of making a semiconductor assembly defining a thickness dimension, an up direction and a down direction, the method comprising the steps of:
   providing an initial-state assembly comprising: (i) a fin layer, (ii) a hard mask layer located on top of at least a portion of the fin layer, and (iii) a sacrificial material layer on the hard mask layer;
   performing a first material removal on the initial-state assembly to yield a second-state assembly; and
   performing a second material removal on the second-state assembly to yield a third-state assembly;
   wherein:
   the fin layer has a footprint including one or more fins and a fin-embedding material and defines: (i) one or more fin regions, and (ii) one or more non-fin regions;
   in the initial-state assembly: (i) the fin layer is thicker in the one or more fin regions than in the one or more non-fin regions, (ii) at least a lower portion of the hard mask layer extends over at least a portion of the one or more non-fin regions of the fin layer, and (iii) the hard mask layer is present over at least a portion of the one or more fin regions of the fin layer;
   in the first material-removal step in a chemical mechanical polish (CMP): (i) a portion of the sacrificial material layer is removed from the one or more fin regions, and (ii) the upper portion of the hard mask layer is used as a stop layer for the first material removal; and
   in the second material-removal step, material removal is selectively performed so that the upper portion of the hard mask layer is removed.

2. The method of claim 1 wherein the fin-embedding layer has a higher CMP removal rate than does the hard mask layer.

3. The method of claim 1 wherein the fin-embedding layer is made of a material suitable for making gates.

4. The method of claim 1 wherein the fin-embedding layer is made of amorphous silicon.

5. The method of claim 1 further comprising the steps of:
   performing a plurality of material removals on the third-state assembly;
   wherein:
   in the plurality of material-removal steps, a portion of the fin layer is removed so that the fin layer has: (i) a uniform thickness, and (ii) a planar top surface.

6. The method of claim 5 wherein the third material-removal step is a CMP process.

7. A method of making a semiconductor assembly defining a thickness dimension, an up direction and a down direction, the method comprising the steps of:
   providing an initial-state assembly comprising: (i) a fin layer, and (ii) a hard mask layer located on top of at least a portion of the fin layer;
   performing a first material addition on the initial-state assembly to yield a modified-state assembly;
   performing a first material removal on the modified-state assembly to yield a second-state assembly;
   performing a second material removal on the second-state assembly to yield a third-state assembly;
   performing a third material removal on the third-state assembly to yield a fourth-state assembly;
   performing a fourth material removal on the fourth-state assembly to yield a fifth-state assembly; and
   performing a fifth material removal on the fifth-state assembly to yield a sixth-state assembly;
   wherein:
   the fin layer has a footprint that includes one or more fins and a fin-embedding material and defines: (i) one or more fin regions, and (ii) one or more non-fin regions;
   in the initial-state assembly: (i) the fin layer is thicker in the one or more fin regions than in the one or more non-fin regions, (ii) at least a lower portion of the hard mask layer extends over at least a portion of the one or more non-fin regions of the fin layer, and (iii) an upper portion of the hard mask layer extends over at least a portion of the one or more fin regions of the fin layer;
   in the first material-addition step, an additional first material layer is deposited over at least a portion of the hard mask layer;
   in the first material-removal step, a portion of the additional first material layer is removed so that: (i) the additional first material layer is removed at least from the one or more fin regions of the fin layer, and (ii) the upper portion of the hard mask layer is used as a stop layer for the first material removal;

in the second material-removal step, the upper portion of the hard mask layer is selectively removed;

in the third material-removal step: (i) any remaining portion of the additional first material layer is removed, (ii) a portion of the fin layer is removed, and (iii) the lower portion of the hard mask layer is used as a stop layer for the third material removal;

in the fourth material-removal step, the lower portion of the hard mask layer is removed; and in the fifth material-removal step, a portion of the fin layer is removed so that the fin layer of the sixth-state assembly has: (i) a uniform thickness, and (ii) a planar top surface.

8. The method of claim 7 wherein the third material-removal step is a chemical mechanical polish (CMP).

9. The method of claim 7 wherein the fin-embedding material and the soft sacrificial layer are made of the same material.

10. The method of claim 7 wherein the fin-embedding material and the soft sacrificial layer are made of amorphous silicon.

11. The method of claim 7 wherein the first material-removal step is a chemical material polish (CMP).

12. The method of claim 7 wherein the second material-removal step is a selective etch.

13. The method of claim 7 wherein the fourth material-removal step is a wet etch.

14. The method of claim 7 wherein the fifth material-removal step is a CMP process.

* * * * *